(12) United States Patent
Breakenridge et al.

(10) Patent No.: US 9,702,911 B2
(45) Date of Patent: Jul. 11, 2017

(54) ADJUSTABLE POWER SENSOR

(75) Inventors: Eric Breakenridge, Clackmannanshire (GB); Clive Robertson, Edinburgh (GB)

(73) Assignee: Keysight Technologies, Inc., Santa Rosa, CA (US)

( * ) Notice: Subject to any disclaimer, the term of this patent is extended or adjusted under 35 U.S.C. 154(b) by 859 days.

(21) Appl. No.: 13/606,215

(22) Filed: Sep. 7, 2012

(65) Prior Publication Data

US 2014/0070793 A1    Mar. 13, 2014

(51) Int. Cl.
  *G01R 1/30*   (2006.01)
  *G01R 21/10*  (2006.01)
  *G01R 21/14*  (2006.01)

(52) U.S. Cl.
  CPC .............. *G01R 21/10* (2013.01); *G01R 21/14* (2013.01)

(58) Field of Classification Search
  CPC .. G01R 19/03; G01R 31/2884; G01R 33/093; G01R 15/06; G01R 19/155; G01R 19/16504; G01R 19/16552; G01R 19/16595; G01R 21/02; G01R 21/10; G01R 21/14; G01R 31/3658
  See application file for complete search history.

(56) References Cited

U.S. PATENT DOCUMENTS

| | | | |
|---|---|---|---|
| 2,854,634 A | 9/1958 | Sharp | |
| 4,000,472 A | 12/1976 | Eastland et al. | |
| 4,004,247 A * | 1/1977 | Van de Plassche | 330/257 |
| 4,820,995 A | 4/1989 | Tamura | |
| 4,943,764 A | 7/1990 | Szente et al. | |
| 5,204,614 A | 4/1993 | Szente et al. | |
| 5,410,745 A | 4/1995 | Friesen et al. | |
| 6,242,901 B1 | 6/2001 | Faick et al. | |
| 6,262,630 B1 | 7/2001 | Eriksson | |
| 6,407,540 B1 | 6/2002 | Shepherd | |
| 6,853,176 B2 | 2/2005 | Lymer | |
| 7,205,832 B2 | 4/2007 | Andle | |
| 7,769,355 B2 | 8/2010 | Ichitsubo et al. | |
| 7,777,477 B2 * | 8/2010 | Takada | 324/76.11 |
| 7,944,196 B2 | 5/2011 | Eken et al. | |

(Continued)

FOREIGN PATENT DOCUMENTS

| CN | 2465401 Y | 12/2001 |
|---|---|---|
| CN | 1367951 A | 9/2002 |

(Continued)

OTHER PUBLICATIONS

Hogan, "A Wide Dynamic Range, Average Power Sensor for Measuring Digitally Modulated Signals", Proceedings of 9th International Conference: Measurement for Success and 9th International Conference on Electromagnetic Measurement, Brighton, UK, Nov. 2-4, 1999, 9 pages.

(Continued)

*Primary Examiner* — Tung X Nguyen

(57) ABSTRACT

A power sensor applies respective first and second currents having substantially equal magnitudes to a reference detector and a measurement detector that are thermally coupled to each other. The power sensor senses an input signal with the measurement detector, and it adjusts the respective magnitudes of the first and second currents by substantially equal amounts to correspondingly adjust a measurement characteristic of the measurement detector.

17 Claims, 19 Drawing Sheets

(56) References Cited

U.S. PATENT DOCUMENTS

2006/0203883 A1    9/2006  Griffin
2011/0193550 A1    8/2011  Eken et al.

FOREIGN PATENT DOCUMENTS

CN      101688889 A    3/2010
EP        1043595 A1  10/2000
GB        2054172 A    2/1981

OTHER PUBLICATIONS

Keysight Technologies, "Fundamentals of RF and Microwave Power Measurements", Application Note, Jul. 31, 2014.
Office Action dated Mar. 31, 2017 in Chinese Application No. 201310340889.3, 20 pages (Unofficial/non-certified translation provided by foreign agent included). [Office Action and CN references only, US references cited in Office Action previously submitted, and are not included in this IDS, nor are these included in the Certification. The Certification applies only to the Chinese Office Action and translations of CN documents].
English language machine translation of CN1367951A, published Sep. 4, 2002, 9 pages.
English language machine translation of CN101688889A, published Mar. 31, 2010, 27 pages.

* cited by examiner

ADJUSTABLE POWER SENSOR

BACKGROUND

Power sensors are commonly used to measure the power of radio-frequency (RF) or microwave-frequency (MW) signals. Such measurements can be used, for instance, to characterize the output performance of electrical components used in RF or MW applications such as radar and cellular telephones. A typical power sensor uses a power detector or transducer to convert the RF or MW power to a readily measurable electrical quantity. Power detectors also have applications in many types of RF and MW systems.

A common type of power sensor used for RF and MW measurements is referred to as a diode power sensor or diode detector. Examples of diode power sensors are described in detail in Agilent Application Note 1449-2 entitled "Fundamentals of RF and Microwave Power Measurements".

Conventional diode power detectors have several shortcomings that tend to limit their performance and flexibility, although, when utilized in a power sensor as part of a power measurement system, sophisticated calibration and data processing techniques can be applied to address some of these shortcomings. One shortcoming is that their bandwidth and sensitivity vary according to different operating conditions such as temperature and input power level. For example, the output voltage of a conventional diode sensor may decrease significantly in response to an increase in the sensor's temperature. Still another shortcoming of conventional diode power sensors is that they exhibit a general tradeoff between detection bandwidth and sensitivity. In other words, bandwidth tends to decrease as sensitivity increases and vice versa. Yet another shortcoming of conventional diode power sensors is that their bandwidth and sensitivity are generally determined by component parameters that are fixed at design time. Accordingly, the sensors are generally designed for a specific targeted application.

In view of these and other shortcomings of conventional power detectors, and power sensors built using them, there is a general need for power detectors and sensors providing stable operation under different operating conditions and capable of adaptive optimization based on the requirements of different applications.

SUMMARY

In a representative embodiment, a method of operating a power sensor comprises applying first and second currents having substantially equal magnitudes to a reference detector and a measurement detector, respectively, wherein the reference detector and the measurement detector are thermally coupled, sensing an input signal with the measurement detector, and adjusting the respective magnitudes of the first and second currents by substantially equal amounts to correspondingly adjust a measurement characteristic of the measurement detector.

In another representative embodiment, an apparatus comprises a measurement detector configured to receive an input signal, a variable current source configured to provide first and second currents of substantially equal magnitude to a reference detector and the measurement detector, respectively, wherein the reference detector and the measurement detector are thermally coupled, and a circuit configured to adjust the first and second currents by substantially equal amounts to correspondingly adjust a measurement characteristic of the measurement detector.

BRIEF DESCRIPTION OF THE DRAWINGS

The described embodiments are best understood from the following detailed description when read with the accompanying drawing figures. Wherever applicable and practical, like reference numerals refer to like elements.

DETAILED DESCRIPTION

Figure 1A:
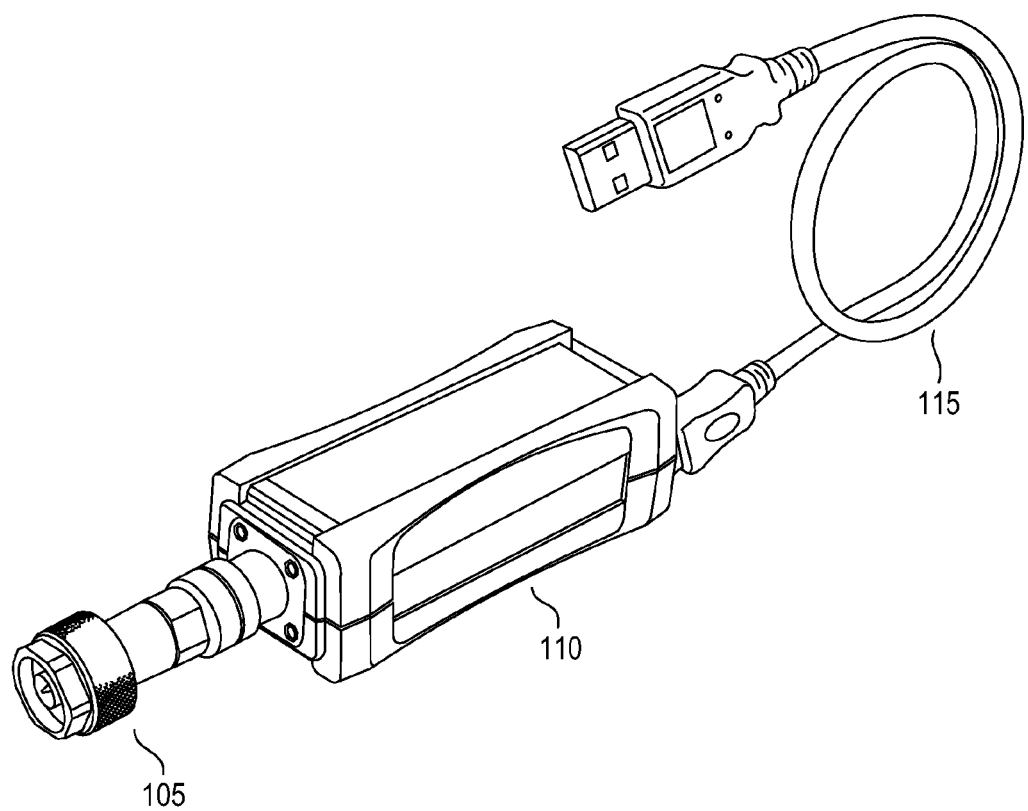
FIG. 1A is a schematic diagram of a power sensor according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices.

The described embodiments relate generally to power sensors for measuring the electrical power of RF or MW signals. In certain embodiments, a power sensor comprises a measurement detector and a reference detector that are thermally coupled to each other. A variable current source provides respective first and second currents of substantially equal magnitude to the reference detector and the measurement detector, and a circuit adjusts the first and second currents by substantially equal amounts to achieve a desired characteristic of the measurement detector. In general, two values (e.g., current magnitudes or adjustment amounts) are deemed to be substantially equal if they differ by no more than a de minimus amount such as that due to typical operating margins, manufacturing tolerances, or other variable factors within the relevant context. Two values are also deemed to be substantially equal if their difference is so small as to have a minimal or negligible effect on performance compared with values that are exactly equal.

The measurement and reference detectors typically comprise power sensor diodes, and the adjusted measurement characteristic typically comprises the bandwidth or sensitivity of the power sensor. The bandwidth, sensitivity, and other measurement characteristics can be adjusted to vary the performance of the power sensor according to different applications. They can also be adjusted to compensate for temperature dependent behavior of the power sensor.

The measurement and reference detectors are typically arranged in a bridge configuration in which a measurement value is generated as a difference between an output of the measurement detector and an output of the reference detector. The use of the bridge configuration allows for subtraction of an offset encountered in a conventional biased diode.

The first and second currents are typically controlled using a current mirror circuit. The current mirror circuit provides a bias current that lowers video resistance of the power sensor and allows measurement with a high impedance amplifier, thus increasing sensitivity. In addition, the bias current can be controlled through the current mirror to extend an upper range of the square law region of the diode power sensors.

FIG. 1A is a diagram of a diode power sensor 100 for a power measurement system according to a representative embodiment. This diagram is provided in order to illustrate one possible form factor and application of a diode power sensor. However, the described embodiments can be implemented in many alternative forms or contexts, for example, as an integrated circuit performing power detection within and RF or MW system.

Referring to FIG. 1, diode power sensor 100 comprises an input interface 105, a sensor body 110, and an output interface 115. Input interface 105 comprises a type N connector configured to receive an input RF signal transmitted from a DUT through a coaxial cable. Alternatively, it may comprise another type of connector, such as a Bayonet Neill-Concelman (BNC) connector. Sensor body 110 comprises a circuit configured to measure the electrical power of the input RF signal to produce a measurement value. Output interface 115 comprises a universal serial bus (USB) connector configured to receive control commands and transmit the measurement value to an electronic device such as a measurement instrument or a computer. The measurement instrument or computer can then be used to display and analyze the measurement value.

Figure 1B:
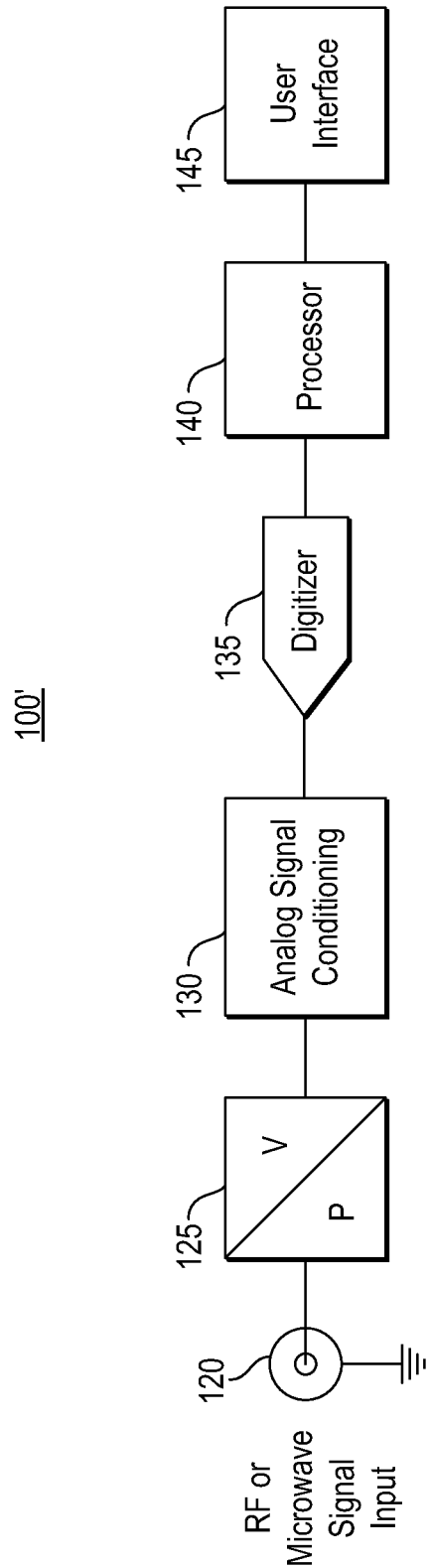
FIG. 1B is a block diagram of a power sensor according to a representative embodiment.

FIG. 1B is a block diagram of a power sensor 100' according to a representative embodiment. This block diagram represents one possible implementation of diode power sensor 100 shown in FIG. 1A.

Referring to FIG. 1B, power sensor 100' comprises an RF input terminal 120, a transducer (or power detector) 125, an analog signal conditioning unit 130, a digitizer 135, a processor 140, and a user interface 145. These features operate in a sequence as shown in FIG. 1B to convert an RF input signal into a digital measurement value to be displayed on user interface 145.

Figure 2:
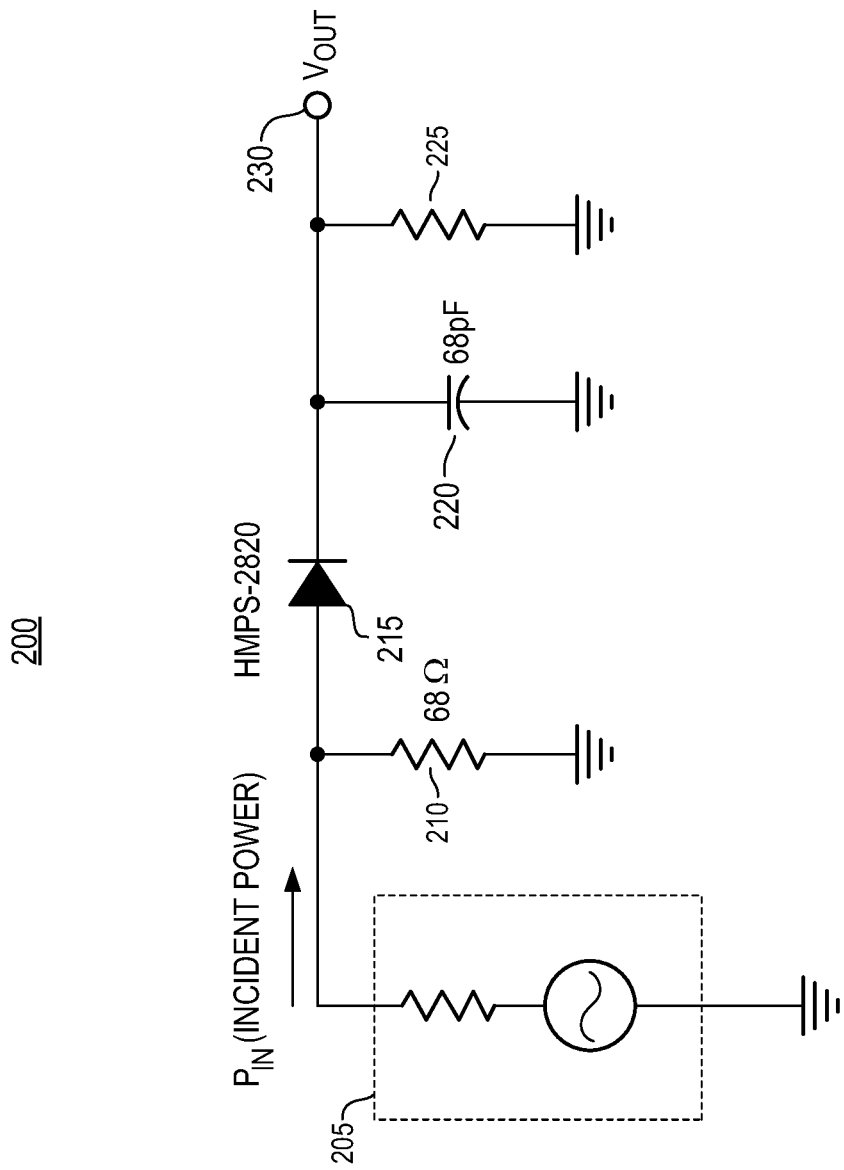
FIG. 2 is a circuit diagram of a diode circuit for a power sensor such as that illustrated in FIG. 1.

FIG. 2 is a circuit diagram of a diode circuit 200 for a diode power detector such as that illustrated in FIG. 1. Diode circuit 200 is typically used to measure the power of an input RF or MW signal.

Referring to FIG. 2, diode circuit 200 comprises a driving source 205, a shunt resistor 210, a diode 215 (e.g., a Schottky diode), a shunt capacitor 220, a load resistor 225, and an output terminal 230. Driving source 205 is a direct connection to a DUT source power $P_{IN}$ where the detector is used in a terminating power sensor application. Driving source 205 could also be part of a circuit that comprises a directional coupler that samples DUT source power $P_{IN}$. Shunt resistor 210 provides a low voltage standing wave ratio (VSWR) termination for driving source 205, and shunt capacitor 220 filters an output signal of diode 215 to produce an output signal $V_{OUT}$ at output terminal 230.

Due to its simple design, diode circuit 200 is relatively inexpensive to implement. However, it has limited applications because its output voltage has poor linearity with respect to the input power, and its performance tends to vary as a function of temperature and the load attached to output terminal 230. In particular, the bandwidth and sensitivity of diode circuit 200 tend to vary according to the magnitude of the load and as a result of changes in temperature. The temperature dependent behavior is particularly troublesome because it can lead to substantial deviations in measured values as the power sensor or surrounding components heat up during operation.

Figure 3:
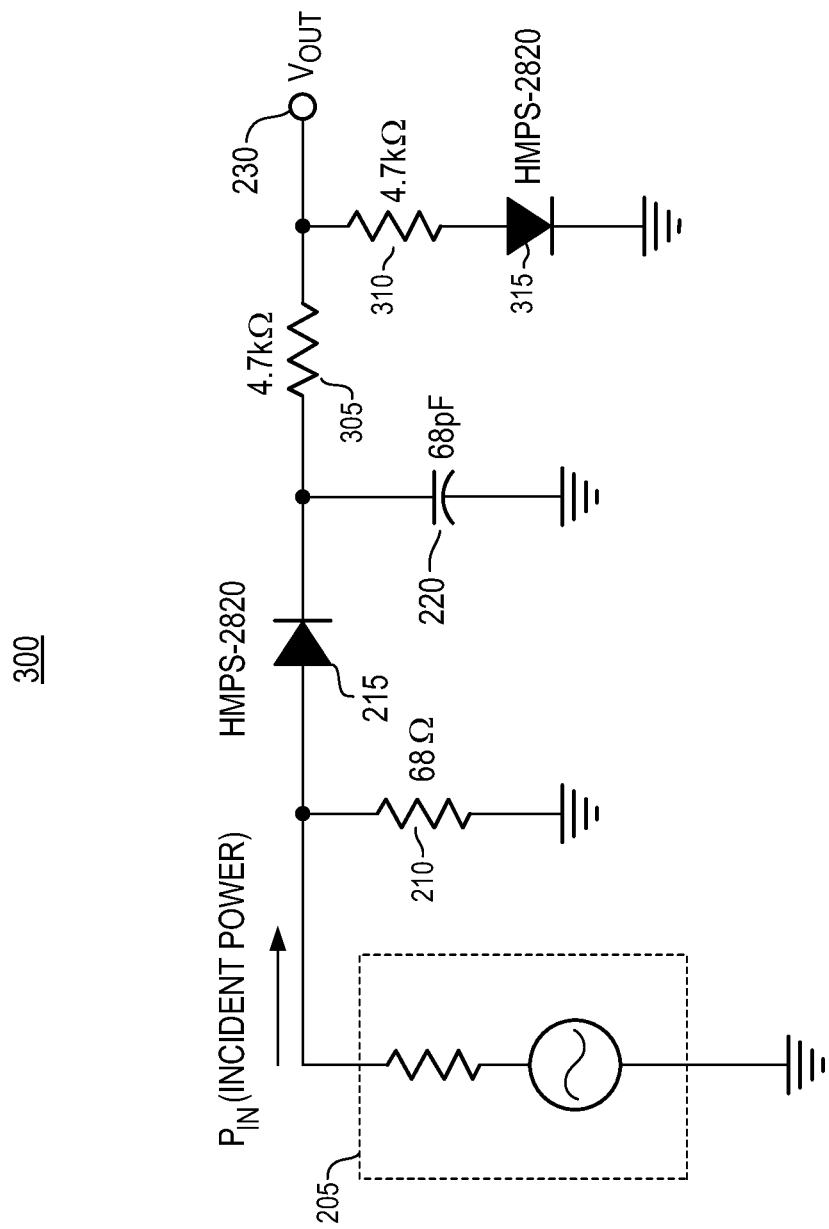
FIG. 3 is a circuit diagram of another diode circuit for a power sensor such as that illustrated in FIG. 1.

FIG. 3 is a circuit diagram of another diode circuit 300 for a power sensor such as that illustrated in FIG. 1. Diode circuit 300 is designed to reduce temperature-dependent behavior such as that exhibited by diode circuit 200.

Referring to FIG. 3, diode circuit 300 is similar to diode circuit 200, except that it further comprises an output resistor 305, a shunt resistor 310, and a shunt diode 315 connected between diode 215 and output terminal 230. The presence of output resistor 305 and shunt resistor 310 tends to improve the linearity of diode circuit 300, and shunt diode 315 compensates for temperature-dependent behavior of diode 215. Accordingly, the operation of diode circuit 300 tends to be more stable than that of diode circuit 200.

Nevertheless, diode circuit 300 suffers from a general tradeoff between sensitivity and bandwidth, which affects its performance and flexibility. In particular, the sensitivity and bandwidth of diode circuit 300 vary inversely according to the magnitude of a load resistance connected to output terminal 230. Accordingly, an increase in sensitivity is generally accompanied by a decrease in bandwidth and vice versa. In addition, the values of components in diode circuit 300 are typically fixed at design time and cannot be adjusted thereafter if a need for greater sensitivity or bandwidth arises.

Figure 4:
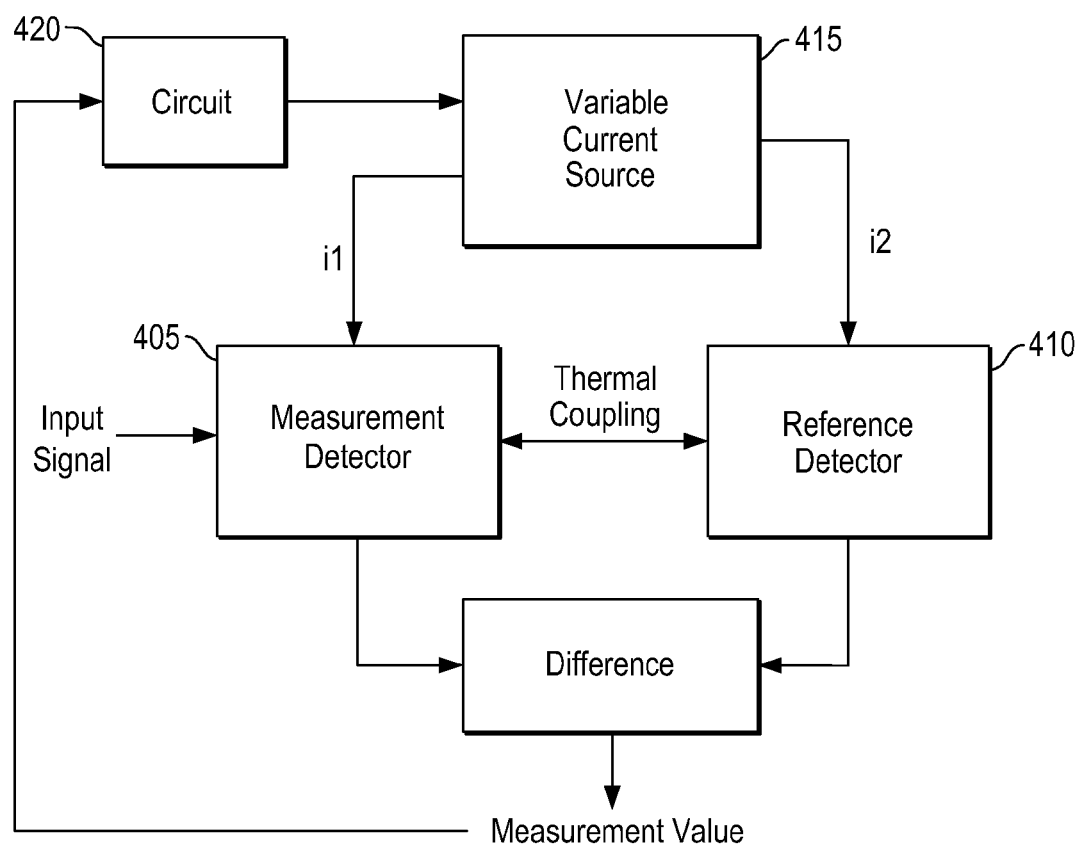
FIG. 4 is a block diagram of a power sensor according to a representative embodiment.

FIG. 4 is a block diagram of a power sensor 400 according to a representative embodiment. In contrast to the embodiments of FIGS. 2 and 3, the embodiment of FIG. 4 allows bandwidth and sensitivity to be adaptively modified in response to the requirements of particular applications or circumstances. It also allows adjustments to compensate for temperature based performance variation. As described below, these adjustments are performed by changing the magnitude of respective bias currents provided to a measurement detector and a reference detector.

Referring to FIG. 4, power sensor 400 comprises a measurement detector 405, a reference detector 410, a variable current source 415, and a control circuit 420. Collectively, these features operate to transform an input signal (e.g., an RF or MW signal) from a DUT into a measurement value representing the signal's power. The input signal can be provided through various alternative interfaces. For example, in some embodiments, the input signal is provided through a wired interface such as a coaxial cable or directional coupler; in other embodiments, it can be provided through a wireless interface such as an antenna.

Measurement detector 405 receives the input signal and a first current i1, and it produces a measurement value. Although not shown in FIG. 4, the measurement value is typically output to an apparatus that can be used to capture and analyze the measurement value. For example, it may be output to an analog to digital converter (ADC), which may digitize the measurement value and output it to an electronic device such as a computer or an electronic test instrument.

Reference detector 410 receives a second current i2, which is controlled to have substantially the same magnitude as current i1. Reference detector 410 is implemented with components similar to those of measurement detector 405, and it is thermally coupled to measurement detector 405 such that temperature dependent variations occur in substantially the same way in both detectors. As described below, the thermal coupling can take several alternative forms. For example, thermal coupling can occur between components located on the same chip, or it can occur between components on different chips that are connected via a thermal conduit.

Because measurement detector 405 and reference detector 410 respond to temperature fluctuations in substantially the same way, they tend to cancel out or compensate for their individual temperature dependent behaviour. Accordingly, first and second forward voltages corresponding to first and second currents i1 and i2 vary by substantially the same amount in response to temperature changes, allowing measurement detector 405 to produce stable measurements even in the presence of temperature changes.

Variable current source 415 provides first and second currents i1 and i2 of substantially equal magnitude to reference detector 410 and measurement detector 405. The respective magnitudes of the currents can be controlled, for instance, by a current mirror.

Control circuit 420 controls variable current source 415 to adjust first and second currents i1 and i2 by substantially equal amounts to correspondingly adjust a measurement characteristic of measurement detector 405. For example, control circuit 420 may control variable current source 415 to increase or decrease first and second currents i1 and i2 to adjust the bandwidth or sensitivity of measurement detector 405. Such adjustments can be made adaptively (e.g., programmatically or automatically) based on predefined settings, code, user instructions, and so on. The adjustments may be made, for example, to meet the performance requirements of different applications requiring different amounts of sensitivity or bandwidth. They can also be made within the context of a single application in order to achieve measurements across a broader range of parameters.

In the example of FIG. 4, the measurement value output by measurement detector 405 is fed back to control circuit 420 so that adjustments can be performed in a closed loop fashion. However, in other embodiments, control circuit 420 may perform adjustments without actually receiving a measurement value. In addition, in some embodiments, control circuit 420 may monitor first and second currents i1 and i2 in order to adjustment their respective magnitudes based on feedback or general monitoring. In such embodiments, control circuit 420 may comprise, for instance, a digital to analog converter (DAC) or digital potentiometer driving a current source or current mirror.

Figure 5:
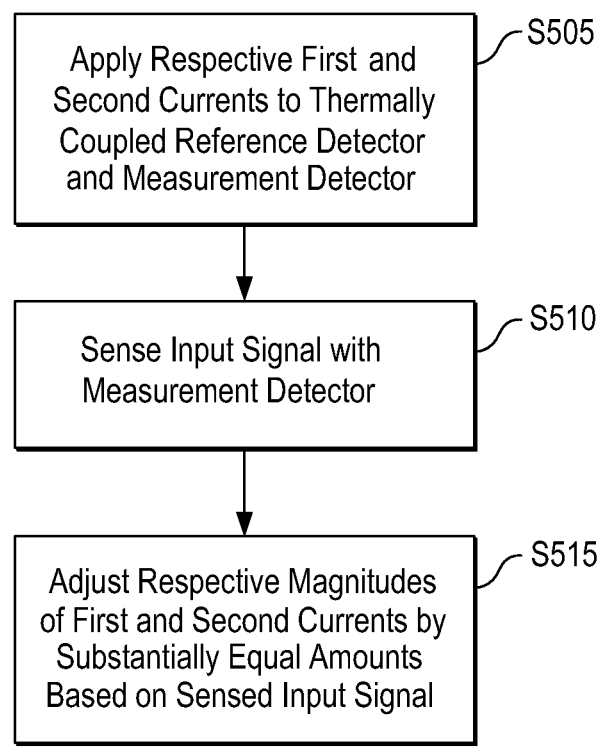
FIG. 5 is a flowchart illustrating a method of operating a power sensor according to a representative embodiment.

FIG. 5 is a flowchart illustrating a method of operating a power sensor according to a representative embodiment. For explanation purposes, it will be assumed that the method of FIG. 5 is performed by power sensor 400 of FIG. 4. However, the method is not limited to a particular platform and could be performed by various alternative apparatuses. In the description that follows, example method features will be indicated by parentheses.

Referring to FIG. 5, the method comprises applying first and second currents having substantially equal magnitudes to measurement detector and a reference detector, respectively, wherein the measurement detector and the reference detector are thermally coupled (S505). For instance, the method may apply respective first and second currents i1 and i2 to measurement detector 405 and reference detector 410 using variable current source 415.

The method further comprises sensing the power of an input signal with the measurement detector (S410). For example, measurement detector 405 may sense the input signal shown in FIG. 4 using a diode power detector. The measurement value proportional to the input power will be the difference between the measurement detector 405 output and the reference detector 410 output.

Finally, the method comprises adjusting the respective magnitudes of the first and second currents by substantially equal amounts to correspondingly adjust a measurement characteristic of the measurement detector (S515). For example, first and second currents i1 and i2 may be adjusted by control circuit 420 in order to achieve a target measurement bandwidth or target measurement sensitivity of measurement detector 405. The target sensitivity may be achieved, for instance, by extending a region of linear power conversion of measurement detector 405.

In some embodiments, the adjustment is performed by operating at least one current mirror to maintain the first and second currents at substantially equal magnitude. The first and second currents are typically provided by a variable current source that is controlled to adjust a bias component of the respective first and second currents. The adjustment is typically based on a power level sensed by a diode power sensor within the measurement detector.

Figure 6:
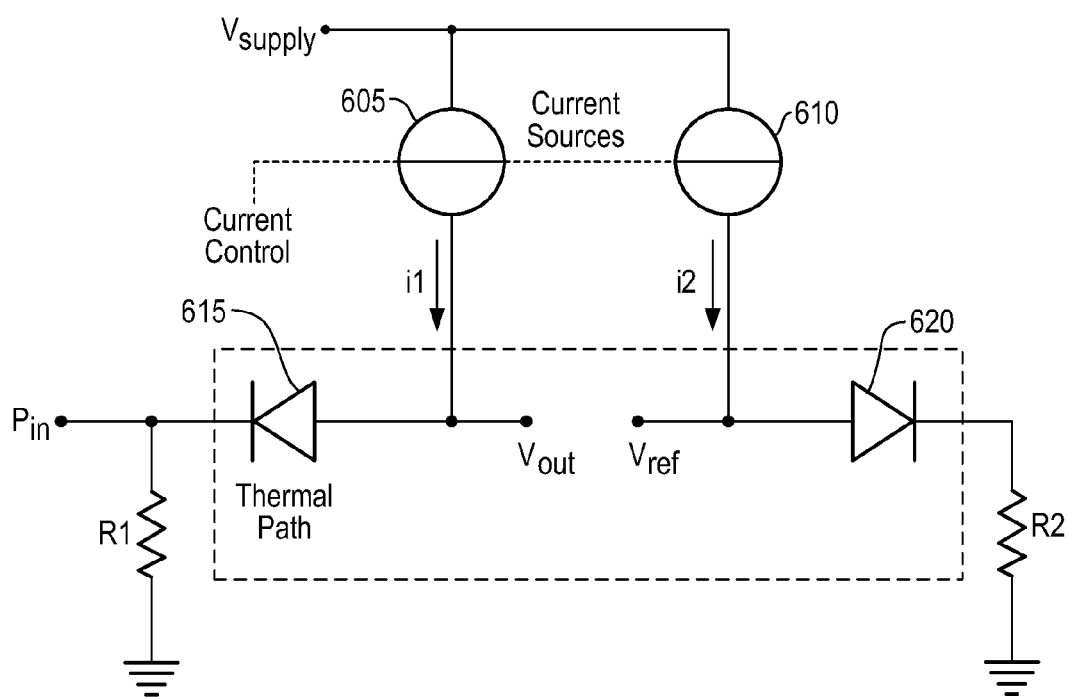
FIG. 6 is a circuit diagram of a power sensor according to a representative embodiment.

FIG. 6 is a circuit diagram of a power sensor 600 according to a representative embodiment. The power sensor of FIG. 6 can be viewed as a specific implementation of power sensor 400 of FIG. 4.

Referring to FIG. 6, power sensor 600 comprises first and second current sources 605 and 610 configured to generate respective first and second currents i1 and i2. These current sources are arranged in a current mirror configuration and have a common voltage source Vsupply. In addition, they are controlled by a common current control mechanism such that first and second currents i1 and i2 can be adjusted in combination to modify the amount of bias current within power sensor 600. The current control mechanism may operate according to an automatic or preprogrammed control scheme, according to user inputs, or a combination thereof.

Power sensor 600 further comprises a measurement detector 615 and a reference detector 620, which are thermally coupled to each other as indicated by a dotted box and are both implemented by a power sensor diode or diode detector. Measurement detector 615 has an output connected to an input terminal Pin of power sensor 600 and further connected to ground through a first resistor R1, and an input connected to a first output terminal Vout of power sensor 600 and further connected to an output of first current source 605. Reference detector 620 has an input connected to ground through a second resistor R2 and an output connected to a second output terminal Vref of power sensor 600 and further connected to an output of second current source 610.

During typical operation, power sensor 600 receives an RF or MW input signal through input terminal Pin, and it produces a differential output signal that is detected as a difference between signals at first and second output terminals Vout and Vref.

Figure 7:
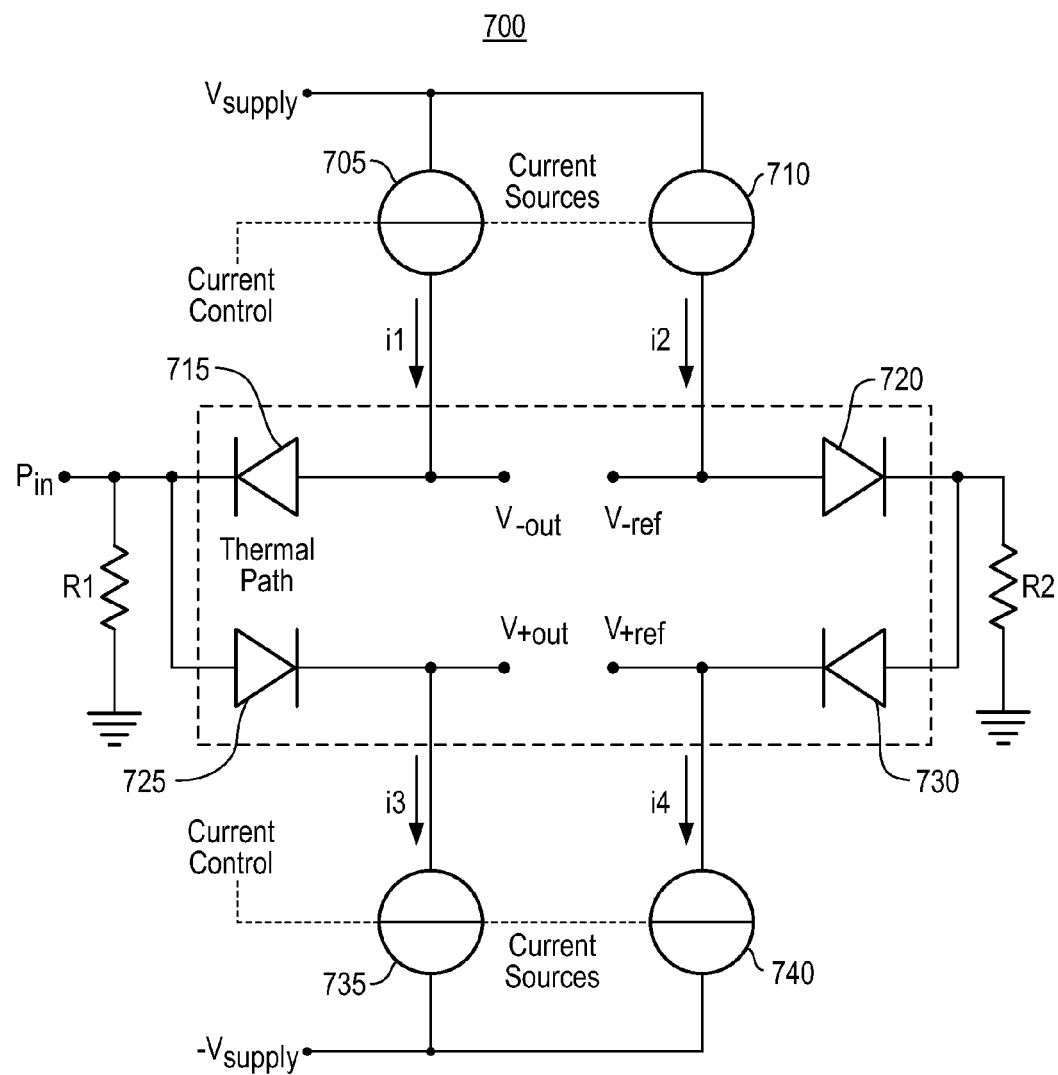
FIG. 7 is a circuit diagram of a power sensor according to another representative embodiment.

FIG. 7 is a circuit diagram of a power sensor 700 according to another representative embodiment. Power sensor 700 is a variation of power sensor 600 in which two current mirrors are used to produce an output signal rather than one current mirror.

Referring to FIG. 7, power sensor 700 comprises first and second current sources 705 and 710 configured to generate respective first and second currents i1 and i2, and third and fourth current sources 735 and 740 configured to generate respective third and fourth currents i3 and i4. First and second current sources 705 and 710 are arranged in a first current mirror, and third and fourth current sources 735 and 740 are arranged in a second current mirror. One of the current mirrors has a positive supply voltage and the other has a negative supply voltage. Both of the supply voltages have substantially the same magnitude, and they are typically controlled by a common control mechanism such that first through fourth currents i1 through i4 of substantially the same or similar magnitude are adjusted in combination to modify the amount of bias current within power sensor 700. The current control mechanism may operate according to an automatic or preprogrammed control scheme, according to user inputs, or a combination thereof.

Power sensor 700 further comprises first and second measurement detectors 715 and 725 and first and second reference detectors 720 and 730, which are thermally coupled to each other as indicated by a dotted box and are each implemented by a power sensor diode or diode detector.

First measurement detector 715 has an input connected to an input terminal Pin of power sensor 700 and further connected to ground through a first resistor R1. First measurement detector 715 also has an output connected to a first positive output terminal V+out of power sensor 700 and further connected to an output of first current source 705. Second measurement detector 725 has an output connected to a first negative output terminal V−out of power sensor 700 and further connected to an output of third current source 735. Second measurement detector 725 also has an input connected to input terminal Pin of power sensor 700 and further connected to ground through first resistor R1.

First reference detector 720 has an input connected to ground through a second resistor R2. First reference detector 720 also has an output connected to a second positive output terminal V+ref of power sensor 700 and further connected to an output of second current source 710. Second reference detector 730 has an output connected to a second negative output terminal V−ref of power sensor 700 and further connected to an output of fourth current source 740. Second reference detector 730 also has an input connected to ground through second resistor R2.

During typical operation, power sensor 700 receives an RF or MW input signal through input terminal Pin, and it produces a differential output signal that is detected as a difference between signals at first and second positive output terminals V+out and V+ref and first and second negative output terminals V−out and V−ref. This difference can be represented by the following equation: (V+out−V+ref)−(V−out−V−ref).

In general, the signals at first and second positive output terminals V+out and V+ref can be referred to as a first measurement voltage and a first reference voltage, respectively, and the signals at the first and second negative output terminals V−out and V−ref can be referred to as a second measurement voltage and a second reference voltage, respectively. Accordingly, the first current mirror of FIG. 7 may regulate the first measurement voltage and the first reference voltage, and the second current mirror regulates the second measurement voltage and the second reference voltage.

Figure 8:
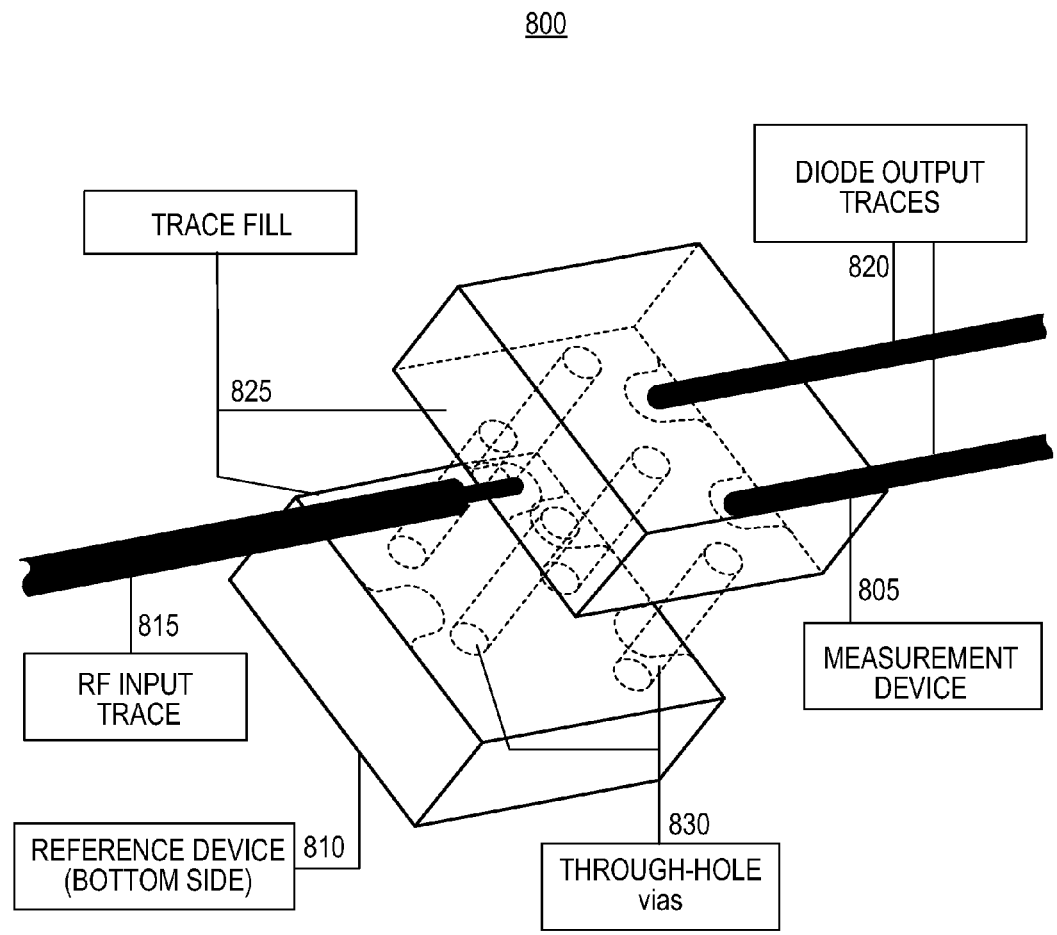
FIG. 8 is a perspective view of a power sensor comprising a measurement detector and a reference detector that are thermally coupled to each other by through-hole vias according to a representative embodiment.

FIG. 8 is a perspective view of a power sensor 800 comprising a measurement detector and a reference detector that are thermally coupled to each other by through-hole vias according to a representative embodiment. Power sensor 800 can be implemented with a circuit configuration similar to power sensor 600 or 700, for instance, with thermal coupling provided by additional features shown in FIG. 8. Other forms of thermal coupling could be applied through close proximity in other circuit board implementations or through implementation of all detector components in a single integrated circuit.

Referring to FIG. 8, power sensor 800 comprises a measurement device 805 and a reference device 810. These devices typically comprise separate packages containing a respective measurement detector and a reference detector such as those illustrated in FIG. 7 or 8, for instance. Although not shown in FIG. 8, measurement device 805 and reference device 810 are typically mounted on opposite sides of a printed circuit board (PCB) in order to maintain a relatively short thermal path between them. As an example, measurement device 805 is labeled as being on a top side of the PCB and reference device 810 is labeled as being on a bottom side of the PCB. In addition, although not shown in FIG. 8, measurement device 805 and reference device 810 may be mounted on different thermal pads on the PCB to facilitate efficient thermal conduction.

Power sensor 800 further comprises an RF input trace 815 for providing an input signal to measurement device 805, and diode output traces 820 for outputting a differential output signal indicative of a power measurement performed on the input signal. Power sensor 800 still further comprises trace fill 825 for circuit traces in measurement device 805 and reference device 810. Finally, power sensor 800 comprises through-hole vias 830 forming a thermal conduit that extends between measurement device 805 and reference device 810 to provide thermal coupling. Through-hole vias 830 typically extend through holes in the PCB, and they are connected to respective thermal pads on which measurement device 805 and reference device 810 are mounted.

Figure 9:
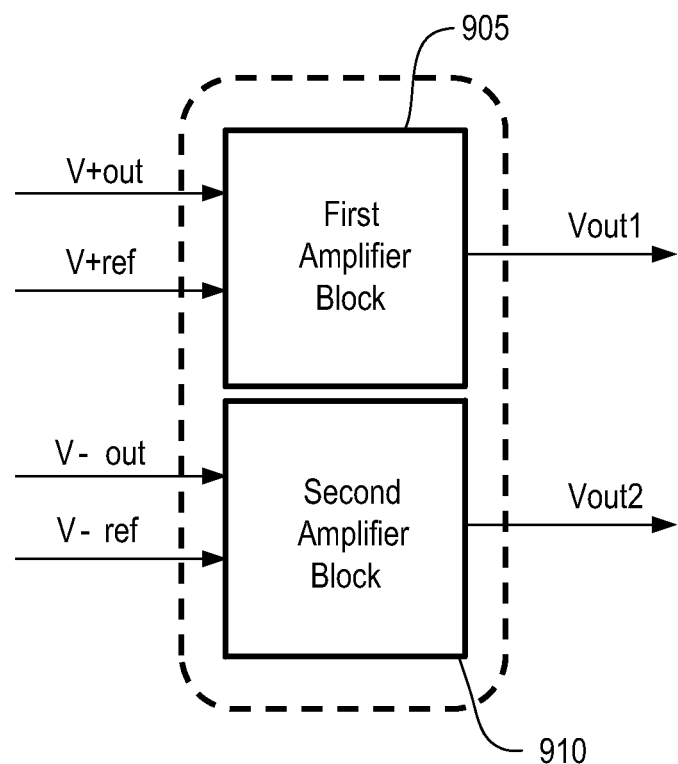
FIG. 9 is a block diagram of an instrumentation amplifier that can be used in conjunction with a power sensor according to a representative embodiment.

FIG. 9 is a block diagram of an instrumentation amplifier 900 that can be used in conjunction with a power sensor according to a representative embodiment. For example, instrumentation amplifier 900 can be used to convert output signals such as those produced by power sensor 700 into a differential signal pair that can be used by downstream electronic components such as an ADC, computer, or electronic test instrument.

Referring to FIG. 9, instrumentation amplifier 900 receives first and second measurement voltages and the first and second reference voltages output by a power sensor. In this example, it will be assumed that the first and second measurement voltages provided through first positive output terminal V+out and first negative output terminal V−out of power sensor 700, and the first and second reference voltages are provided through second positive output terminal V+ref and second negative output terminal V−ref of power sensor 700.

Instrumentation amplifier 900 comprises a first amplifier block 905 configured to amplify a difference between the first measurement voltage and the first reference voltage to generate a first output signal Vout1, and a second amplifier block 910 configured to amplify a difference between the second measurement voltage and the second reference voltage to generate a second output signal Vout2. The first and second output signals Vout1 and Vout2 constitute a differential signal pair representing the power level of the input signal of power sensor 700.

Figure 10:
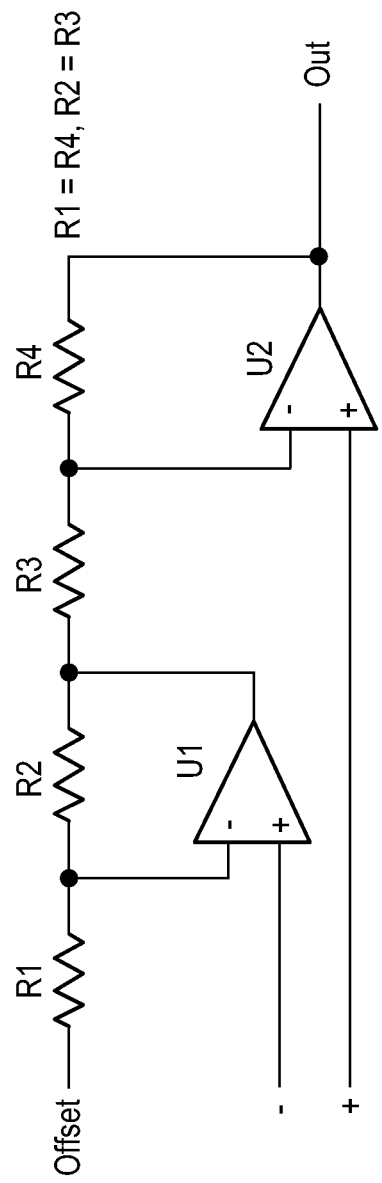
FIG. 10 is a circuit diagram of an instrumentation amplifier that can be used in conjunction with a power sensor according to a representative embodiment.

FIG. 10 is a circuit diagram an instrumentation amplifier 1000 that can be used in conjunction with a power sensor according to a representative embodiment. Instrumentation amplifier 1000 can be used, for instance, to implement one or more of first and second amplifier blocks 905 and 910 of FIG. 9.

Referring to FIG. 10, instrumentation amplifier 1000 comprises first and second amplifiers U1 and U2 (e.g., operational amplifiers) and first through fourth resistors R1 through R4, where R1=R4 and R2=R3. First and second amplifiers U1 and U2 receive respective first and second input signals, and they amplify differences between the received signals as shown in FIG. 10. As illustrated in FIG. 10, an output "Out" of instrumentation amplifier 1000 is determined according to an equation Vout=((V+)−(V−))*(1+(R4/R3))+Voffset. In this equation, Vout represents a voltage level of the output "Out", V+ represents a voltage level of the first input signal, V− represents a voltage level of the second input signal, Voffset represents a voltage level of the variable offset voltage "Offset", and R3 and R4 represent respective resistance values of resistors R3 and R4.

Although the first and second input signals are labeled with positive (+) and negative (−) symbols, these labels do not necessarily restrict the polarity of the respective first and second input signals. For example, the first and second input signals may correspond to the first measurement voltage and the first reference voltage shown in FIG. 9.

The first and second input signals are typically received as outputs of a power sensor, and their amplification provides an indication of a measured power level. As illustrated by the example of FIG. 9, two instrumentation amplifiers may be used in combination to amplify two pairs of signals to generate a differential output signal.

Instrumentation amplifier 1000 tends to exhibit several drawbacks that can limit the overall performance of a power sensor. For example, it has limited gain bandwidth and limited slew rate. Additionally, it has potentially poor offset specification when implemented with fast amplifiers, and it also has poor drive capability.

Figure 11:
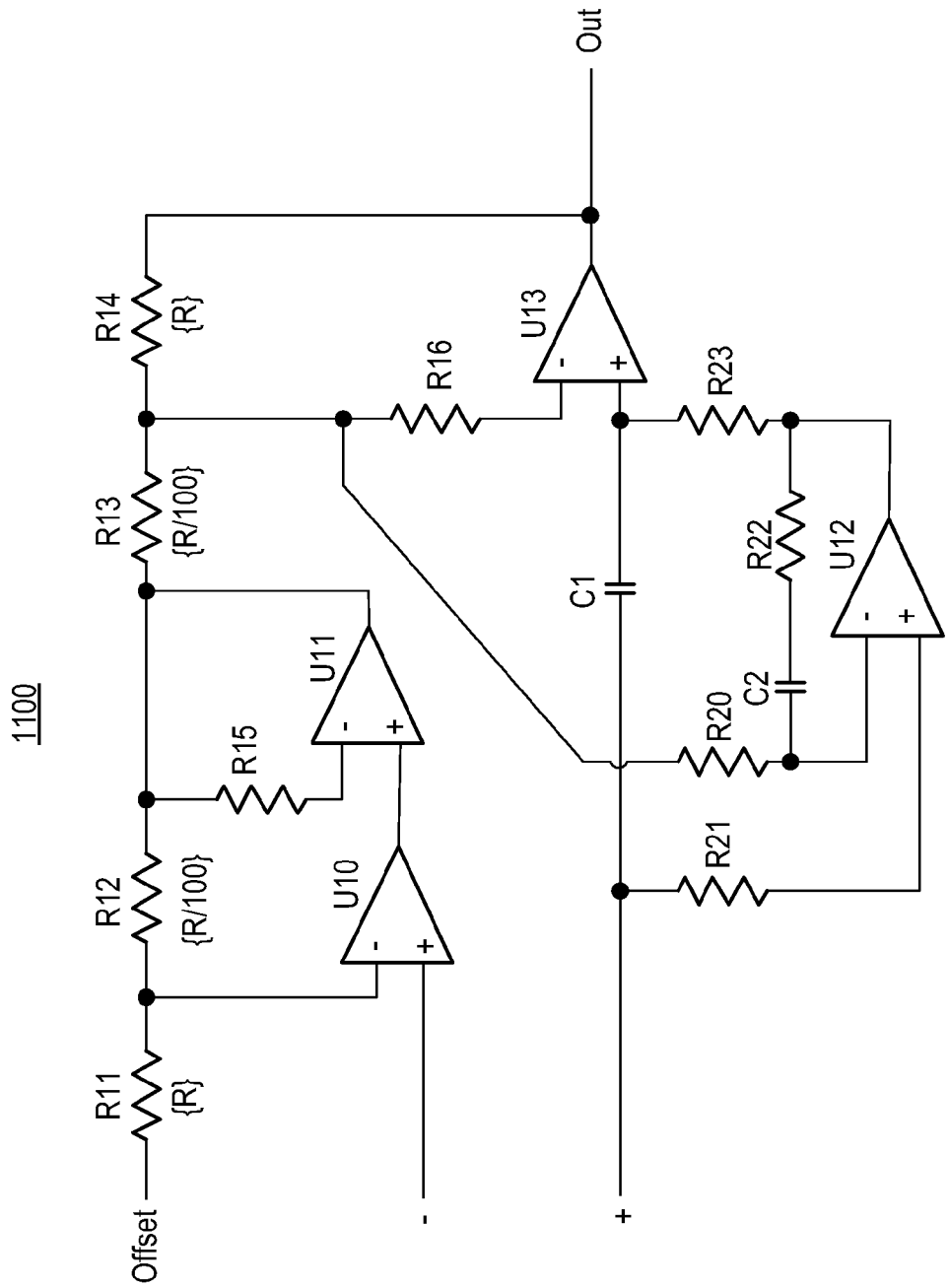
FIG. 11 is a circuit diagram of an instrumentation amplifier that can be used in conjunction with a power sensor according to another representative embodiment.

FIG. 11 is a circuit diagram of an instrumentation amplifier 1100 that can be used in conjunction with a power sensor according to another representative embodiment. Instrumentation amplifier 1100 addresses several of the drawbacks of instrumentation amplifier 1000 and may provide improved performance. In particular, it performs certain functions of the amplifiers in FIG. 10 using four amplifiers to enhance speed and precision.

Referring to FIG. 11, instrumentation amplifier 1100 comprises amplifiers U10, U11, U12, and U13, resistors R11, R12, R13, R14, R15, R16, R20, R21, R22, and R23, and capacitors C1 and C2. Instrumentation amplifier 1100 receives first and second input signals and an offset voltage "Offset", and it produces an output signal "Out" by processing the signals as shown in FIG. 11.

Amplifiers U10 and U12 are high precision, low gain-bandwidth amplifiers, and they are typically implemented as voltage feedback (VFB) amplifiers. These amplifiers act to correct for intrinsic large voltage offset errors of amplifiers U11 and U13. Amplifiers U11 and U13 are fast, high gain-bandwidth, high slew rate amplifiers, and they are typically implemented as current feedback (CFB) type amplifiers. Amplifier U11 buffers an output signal of amplifier U10 and provides low impedance drive to amplifier U13 over the full signal bandwidth. Amplifier U13 provides gain-bandwidth and a low output impedance drive.

Resistors R11, R12, R13, and R14 are gain setting resistors, analogous to resistors shown in FIG. 10. Capacitor C1 and resistor R23 provide alternating current (AC) coupling into amplifier U13, bypassed by amplifier U12 which restores direct current (DC) operating conditions at the output of amplifier U13. Capacitor C2 and resistor R22 maintain loop stability within instrumentation amplifier 1100.

Figure 12A:
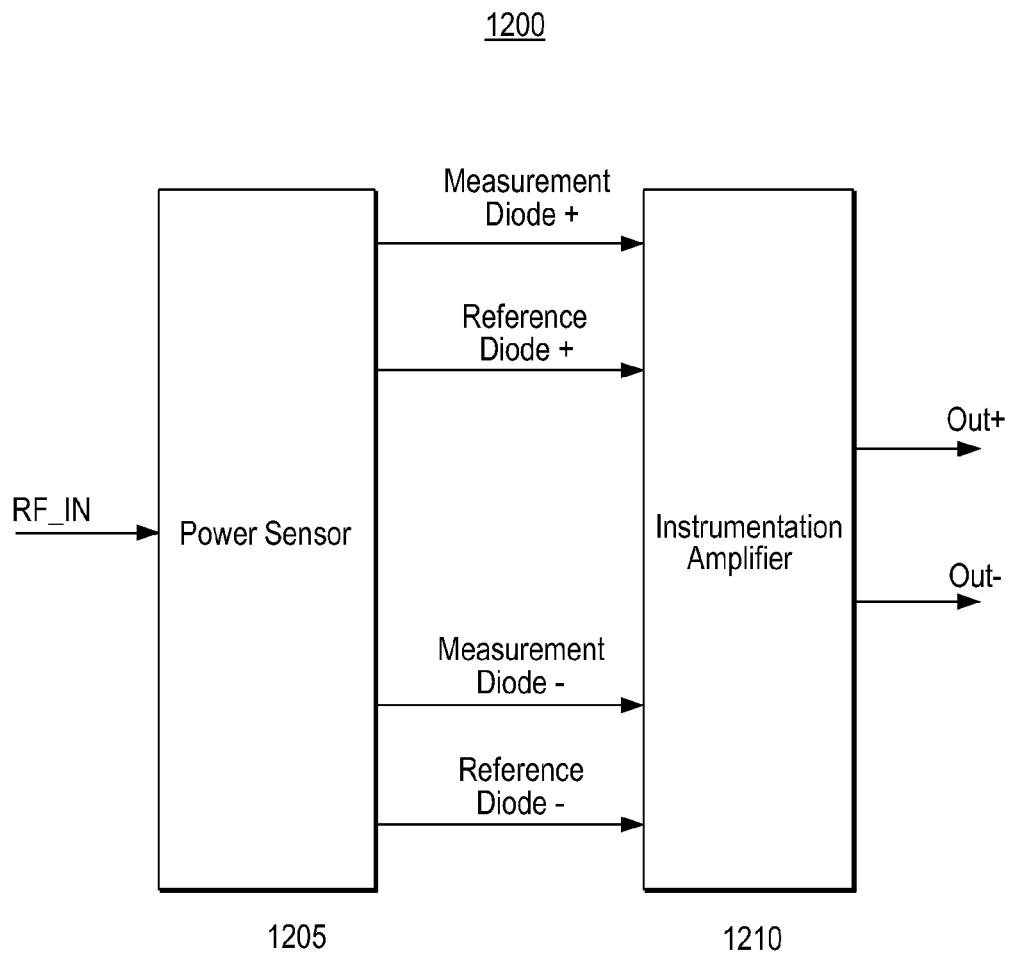
FIGS. 12A through 12C are diagrams of an apparatus comprising a power sensor and an instrumentation amplifier according to a representative embodiment.
Figure 12B:
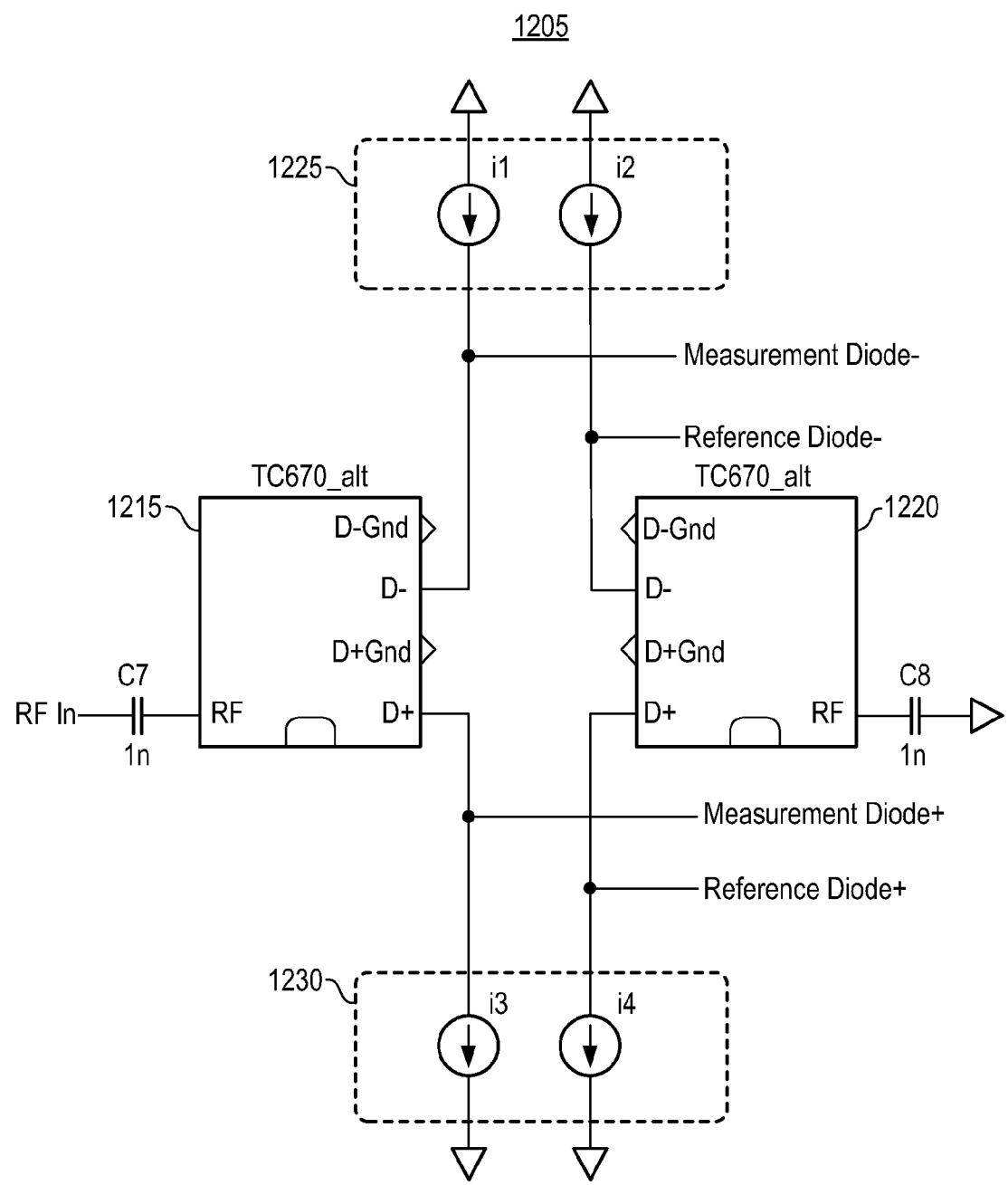
Figure 12C:
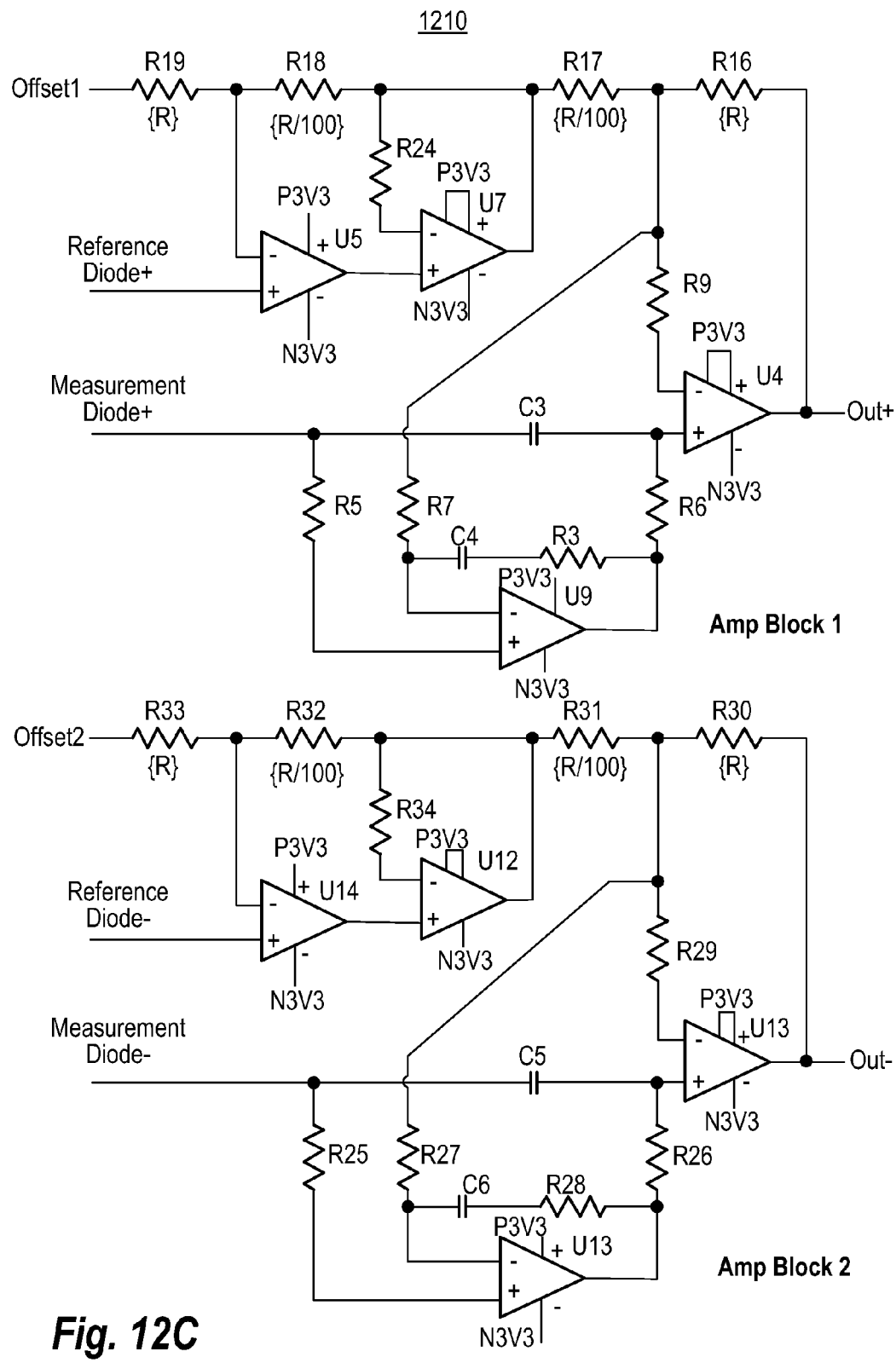

FIGS. 12A through 12C are diagrams of an apparatus 1200 comprising a power sensor 1205 and an instrumentation amplifier 1210 according to a representative embodiment. More specifically, FIG. 12A is a block diagram of apparatus 1200, FIG. 12B is a circuit diagram of an example of power sensor 1205, and FIG. 12C is a circuit diagram of an example of instrumentation amplifier 1210.

Referring to FIG. 12A, apparatus 1200 converts an RF input signal RF_IN into a differential output signal Out+/Out−. RF input signal RF_IN is typically provided to power sensor 1205 from a DUT. Power sensor 1205 employs a measurement diode detector and a reference diode detector to convert RF input signal RF_IN into first and second measurement voltages "Measurement Diode+" and "Measurement Diode−" and first and second reference voltages "Reference Diode+" and "Reference Diode−". These output voltages are analogous to output voltages illustrated in FIG. 7 and FIG. 12B. Instrumentation amplifier 1210 amplifies a difference between the first measurement voltage and the first reference voltage and outputs the result as a first output voltage "Out+". It also amplifies a difference between the second measurement voltage and the second reference voltage and outputs the result as a second output voltage "Out−". These respective amplifications can be performed by separate amplifier blocks as illustrated, for instance, in FIG. 9 and FIG. 12C.

In various alternative embodiments, power sensor 1205 and instrumentation amplifier 1210 may take many different forms, such as those illustrated in FIGS. 4 and 6 through 11, among others. For explanation purposes, FIGS. 12B and 12C show two specific examples of power sensor 1205 and instrumentation amplifier 1210 that can be used in combination with each other.

Referring to FIG. 12B, power sensor 1205 comprises a measurement detector 1215 and a reference detector 1220 connected between respective first and second current mirrors 1225 and 1230. Each of first and second current mirrors 1225 and 1230 comprises two current sources as shown in FIG. 12B. Collectively, measurement detector 1215, reference detector 1220, and first and second current mirrors 1225 and 1230 convert RF input signal RF_IN into the first and second measurement voltages and first and second reference voltages as shown in FIG. 12B.

Referring to FIG. 12C, instrumentation amplifier 1210 comprises first and second amplifier blocks, labelled "Amp Block 1" and "Amp Block 2". Each of the first and second amplifier blocks comprises a circuit substantially the same as instrumentation amplifier 1100 of FIG. 11. Although not specifically labelled in FIG. 12C, certain operational amplifiers in instrumentation amplifier 1210 may be implemented by current feedback amplifiers (CFAs) or voltage feedback amplifiers (VFAs). In this and similar implementations, each of the first and second blocks may comprise at least four operational amplifiers.

The first amplifier block in FIG. 12C amplifies a difference between the first reference voltage ("Reference Diode+") and the first measurement voltage ("Measurement Diode+") to produce the first output voltage ("Out+"). In doing so, it also applies gain and optional offset, if required, to the amplified signal. The second amplifier block performs a similar function for the second reference voltage ("Reference Diode−") and the second measurement voltage ("Measurement Diode−") to produce the second output voltage ("Out−"). Together, the first and second output voltages form a differential signal, which could be applied to a differential input of an analog to digital converter (ADC), for instance.

FIGS. 13A through 13D are graphs illustrating the simulated performance of apparatus 1200 according to a representative embodiment.

Figure 13A:
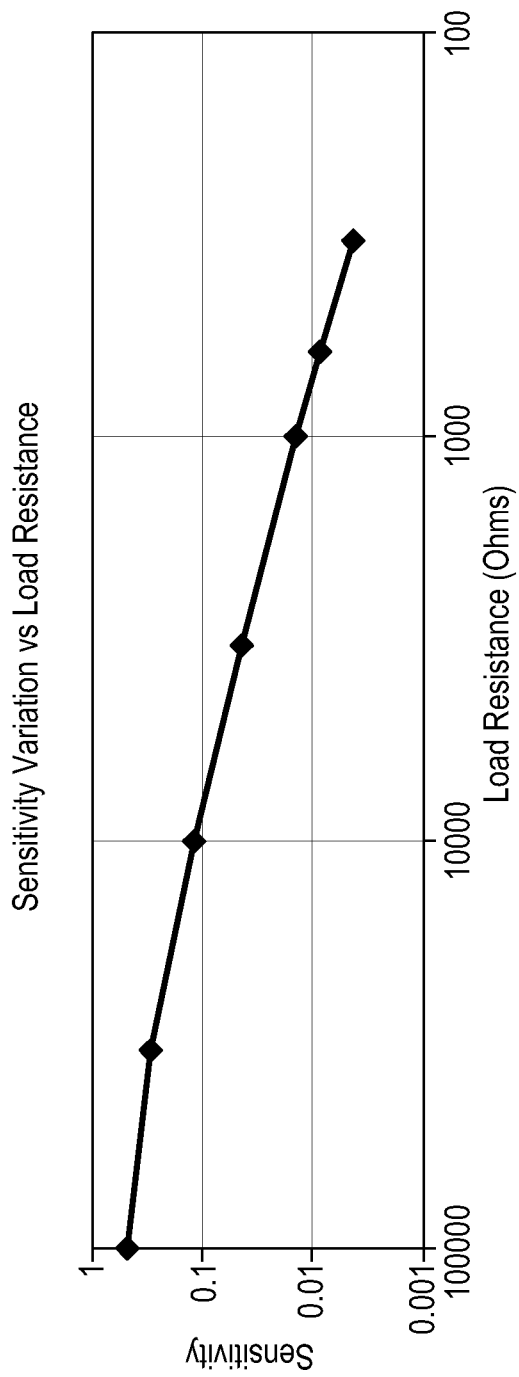
FIGS. 13A through 13D are graphs illustrating the simulated performance of a power sensor according to a representative embodiment.
Figure 13B:
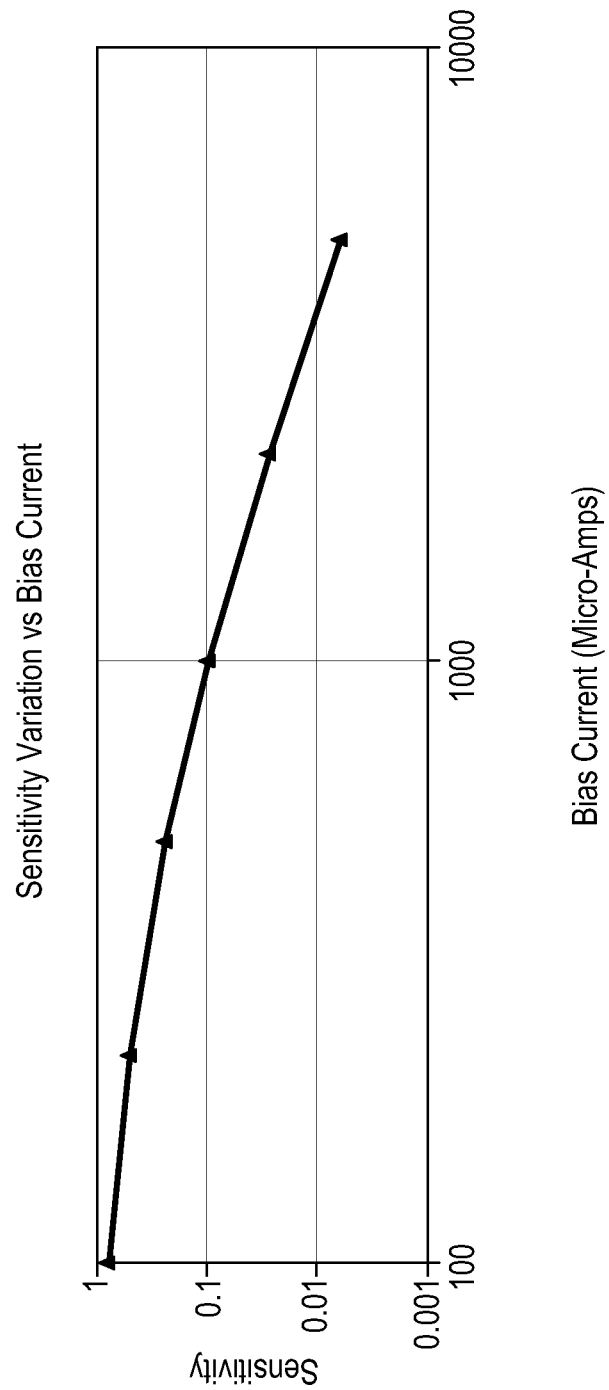

FIGS. 13A and 13B show a representation of a diode detector sensitivity being varied in a standard detector implementation, where a diode load resistor is used to control sensitivity, and in apparatus 1200, respectively, where the diode bias current is used for controlling sensitivity. The range of sensitivity values obtained in both cases is similar, although apparatus 1200 can achieve a higher sensitivity value. Apparatus 1200, however, provides the benefit of allowing dynamic control of the sensitivity.

Figure 13C:
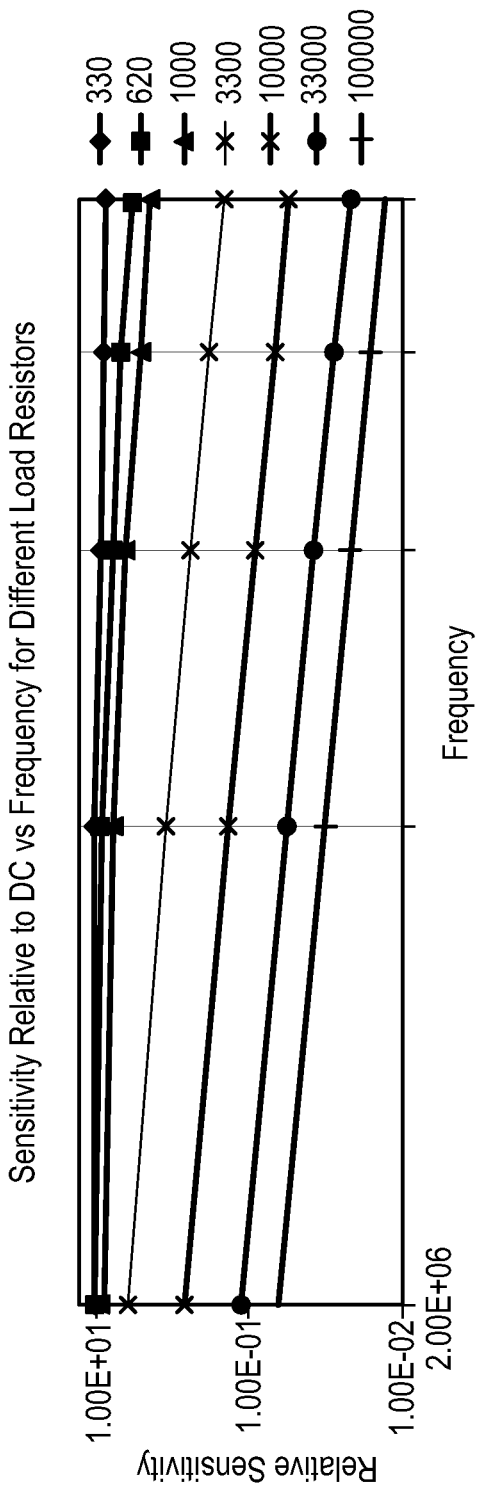
Figure 13D:
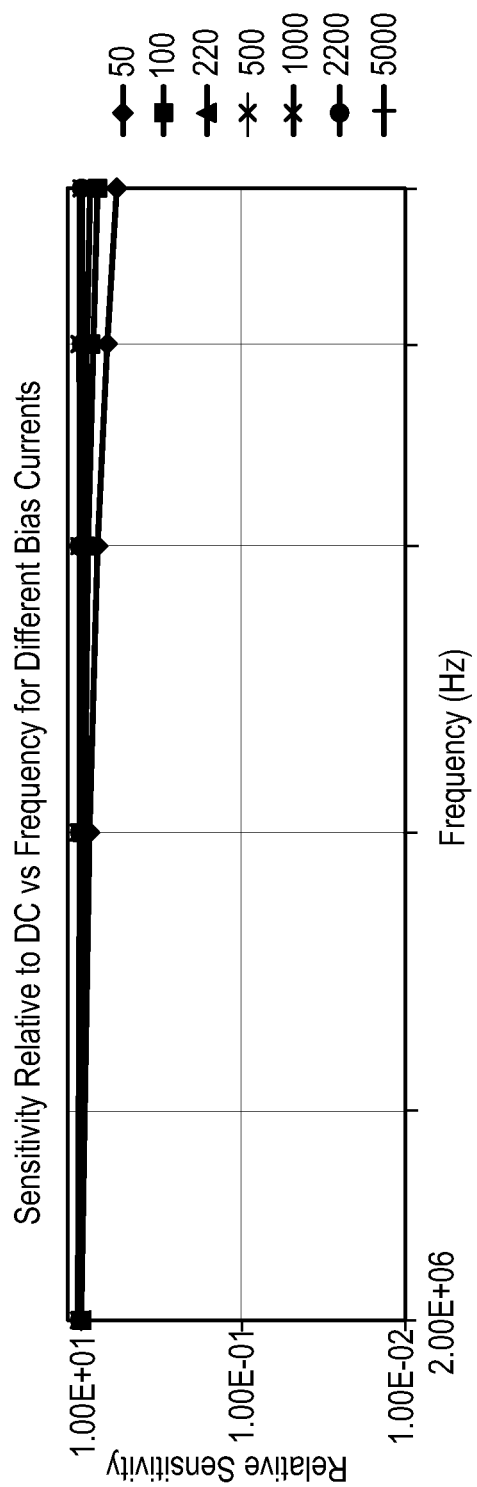

FIGS. 13C and 13D illustrate a diode detector's ability to follow variation of input signal power in a standard detector implementation and in apparatus 1200, respectively. Such variations can occur with a certain frequency, and the bandwidth of modulation of the RF signal represents a maximum frequency of such variations. In one ideal case the detector's sensitivity does not change with the frequency of power variations. In a typical case a particular signal bandwidth is matched to an acceptable degradation in sensitivity with frequency such that the variations in input power are adequately represented. The close relationship between the sensitivity and the change in sensitivity versus frequency for the standard diode detector is illustrated by FIGS. 13A and 13C. As illustrated by these figures, for a small variation in sensitivity versus frequency it may be necessary to accept a correspondingly low sensitivity. For example, load resistance 330 Ohms has a lowest variation of sensitivity with frequency in FIG. 13C, but it also has the lowest overall sensitivity shown in FIG. 13A. In apparatus 1200, the sensitivity variation versus frequency shown in FIG. 13D is of a smaller magnitude than shown in FIG. 13C for a similar range of sensitivity. In certain embodiments, this particular measurement characteristic can changed to match the requirements of the signal being measured.

As indicated by the foregoing, the described embodiments may provide several benefits compared with conventional power sensor technologies. For instance, they may provide stable performance under different temperature conditions and different resistance conditions. In addition, they may allow sensitivity and bandwidth to be adjusted automatically or programmatically according to different target applications or measurement objectives.

In addition to the above benefits, a power sensor in some embodiments may provide high detection bandwidth from a low noise operating point and/or high sensitivity over an extended square-law operating region. In addition, in certain embodiments, first and second currents can be adjusted with a digital potentiometer while monitoring a power sensor in order to tune or optimize the sensor's performance. In contrast, in conventional zero-bias circuits, the use of a digital potentiometer in a rheostat configuration as a variable load may adversely affect performance, due to parasitic elements.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. An apparatus, comprising:
a measurement detector configured to receive an input signal;
a variable current source configured to provide first and second currents of substantially equal magnitude to a reference detector and the measurement detector, respectively, wherein the reference detector and the measurement detector are thermally coupled; and
a circuit configured to adjust the first and second currents by substantially equal amounts to correspondingly adjust a measurement characteristic of the measurement detector.

2. The apparatus of claim 1 wherein adjusting respective magnitudes of the first and second currents is based on a power level of the input signal sensed by the measurement detector.

3. The apparatus of claim 1 wherein the circuit comprises at least one current mirror.

4. The apparatus of claim 1 wherein the variable current source is further configured to adjust respective magnitudes of the first and second currents to achieve a target measurement bandwidth or measurement sensitivity of the measurement detector.

5. The apparatus of claim 1, wherein the reference detector and measurement detector are located on a same chip.

6. The apparatus of claim 1, wherein the reference detector and the measurement detector each comprise at least one diode.

7. An apparatus, comprising:
a measurement detector configured to receive an input signal;
a variable current source configured to provide first and second currents of substantially equal magnitude to a reference detector and the measurement detector, respectively, wherein the reference detector and the measurement detector are thermally coupled; and
a circuit configured to adjust the first and second currents by substantially equal amounts to correspondingly adjust a measurement characteristic of the measurement detector, the circuit comprising:

a first current mirror configured to regulate a first measurement voltage apparent at a positive output terminal of the measurement detector and a first reference voltage apparent at a positive output terminal of the reference detector; and
a second current mirror configured to regulate a second measurement voltage apparent at a negative output terminal of the measurement detector and a second reference voltage apparent at a negative output terminal of the reference detector.

8. The apparatus of claim 7, further comprising:
an instrumentation amplifier configured to receive the first and second measurement voltages and the first and second reference voltages, and further configured to amplify a difference between the first measurement voltage and the first reference voltage to generate a first output signal and to amplify a difference between the second measurement voltage and the second reference voltage to generate a second output signal, wherein the first and second output signals constitute a differential signal pair representing a power level of the input signal.

9. The apparatus of claim 8, wherein the instrumentation amplifier comprises:
a first block configured to amplify the difference between the first measurement voltage and the first reference voltage; and
a second block configured to amplify the difference between the second measurement voltage and the second reference voltage, wherein each of the first and second blocks comprises at least four operational amplifiers.

10. An apparatus, comprising:
a measurement detector configured to receive an input signal;
a variable current source configured to provide first and second currents of substantially equal magnitude to a reference detector and the measurement detector, respectively, wherein the reference detector and the measurement detector are thermally coupled, the reference detector and measurement detector being located on different chips, and thermally coupled through a thermal conduit connected between the different chips; and
a circuit configured to adjust the first and second currents by substantially equal amounts to correspondingly adjust a measurement characteristic of the measurement detector.

11. The apparatus of claim 10, wherein the different chips are mounted on different thermal pads of a printed circuit board (PCB), and the thermal conduit extends between the different thermal pads.

12. The apparatus of claim 7, wherein adjusting respective magnitudes of the first and second currents is based on a power level of the input signal sensed by the measurement detector.

13. The apparatus of claim 7, wherein the variable current source is further configured to adjust respective magnitudes of the first and second currents to achieve a target measurement bandwidth or measurement sensitivity of the measurement detector.

14. The apparatus of claim 10, wherein the reference detector and measurement detector are located on a same chip.

15. The apparatus of claim 10, wherein adjusting the respective magnitudes of the first and second currents is based on a power level of the input signal sensed by the measurement detector.

16. The apparatus of claim 10, wherein the variable current source is further configured to adjust respective magnitudes of the first and second currents to achieve a target measurement bandwidth or measurement sensitivity of the measurement detector.

17. The apparatus of claim 10, wherein the reference detector and measurement detector are located on a same chip.

* * * * *